United States Patent
Duffy et al.

(10) Patent No.: US 10,306,751 B2
(45) Date of Patent: May 28, 2019

(54) DDR ELECTRONIC MODULE ASSEMBLY

(71) Applicant: Hamilton Sundstrand Corporation, Charlotte, NC (US)

(72) Inventors: Jason C. Duffy, Granby, CT (US); James A. Gosse, Storrs, CT (US); Shun-Tien Lin, Glastonbury, CT (US); Michael Maynard, Somers, CT (US); An Nguyen, East Hartford, CT (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 0 days.

(21) Appl. No.: 15/788,862

(22) Filed: Oct. 20, 2017

(65) Prior Publication Data
US 2019/0124760 A1    Apr. 25, 2019

(51) Int. Cl.
| H05K 5/00 | (2006.01) |
| H05K 1/02 | (2006.01) |
| H01R 12/71 | (2011.01) |
| H05K 1/18 | (2006.01) |
| H05K 1/14 | (2006.01) |

(52) U.S. Cl.
CPC ......... *H05K 1/0271* (2013.01); *H01R 12/716* (2013.01); *H05K 1/0201* (2013.01); *H05K 1/144* (2013.01); *H05K 1/181* (2013.01); *H05K 2201/042* (2013.01); *H05K 2201/049* (2013.01); *H05K 2201/068* (2013.01); *H05K 2201/09063* (2013.01); *H05K 2201/10159* (2013.01); *H05K 2201/10189* (2013.01); *H05K 2201/10325* (2013.01); *H05K 2201/10409* (2013.01); *H05K 2201/10522* (2013.01)

(58) Field of Classification Search
None
See application file for complete search history.

(56) References Cited

U.S. PATENT DOCUMENTS

| 5,493,676 | A | 2/1996 | Amundson |
| 5,703,754 | A | 12/1997 | Hinze |
| 6,222,739 | B1 * | 4/2001 | Bhakta .................. G06F 1/184 |
| | | | 257/686 |
| 7,048,564 | B1 | 5/2006 | Hinze |
| 8,259,483 | B1 | 9/2012 | Ayers |
| 9,645,617 | B2 | 5/2017 | Martinez et al. |
| 2008/0242127 | A1 * | 10/2008 | Murr .................. H01R 13/665 |
| | | | 439/79 |

(Continued)

OTHER PUBLICATIONS

European Search Report for Application No. 18189356.1-1203, dated Mar. 13, 2019, 9 pages.

*Primary Examiner* — Courtney L Smith
*Assistant Examiner* — Rashen E Morrison
(74) *Attorney, Agent, or Firm* — Cantor Colburn LLP

(57) ABSTRACT

An electronic module assembly has a memory module that includes a memory module and an electronic module. The memory module includes a first board having a first board first surface disposed opposite a first board second surface. The electronic module is operatively connected to the memory module. The electronic module includes a mounting plate having a mounting plate first surface that is disposed opposite a mounting plate second surface that faces towards the first board first surface. The mounting plate has a first post and a second post spaced apart from the first post.

13 Claims, 1 Drawing Sheet

(56) References Cited

U.S. PATENT DOCUMENTS

| | | | |
|---|---|---|---|
| 2009/0166065 A1* | 7/2009 | Clayton | H05K 1/189 |
| | | | 174/254 |
| 2013/0045611 A1* | 2/2013 | MacDougall | H01R 12/73 |
| | | | 439/55 |
| 2013/0083473 A1 | 4/2013 | Mahran et al. | |
| 2014/0102626 A1* | 4/2014 | Clayton | H05K 3/363 |
| | | | 156/196 |
| 2014/0104776 A1* | 4/2014 | Clayton | H05K 1/181 |
| | | | 361/679.31 |
| 2014/0162470 A1* | 6/2014 | Fricker | H01R 12/523 |
| | | | 439/65 |
| 2015/0118870 A1* | 4/2015 | Swaminathan | H01R 12/716 |
| | | | 439/65 |
| 2015/0173194 A1* | 6/2015 | Pymento | H05K 1/181 |
| | | | 174/250 |
| 2016/0043484 A1* | 2/2016 | Brodsky | H01R 12/716 |
| | | | 439/65 |
| 2017/0013738 A1* | 1/2017 | Jarvis | H01R 43/205 |
| 2017/0293327 A1* | 10/2017 | Lin | G06F 1/182 |

\* cited by examiner

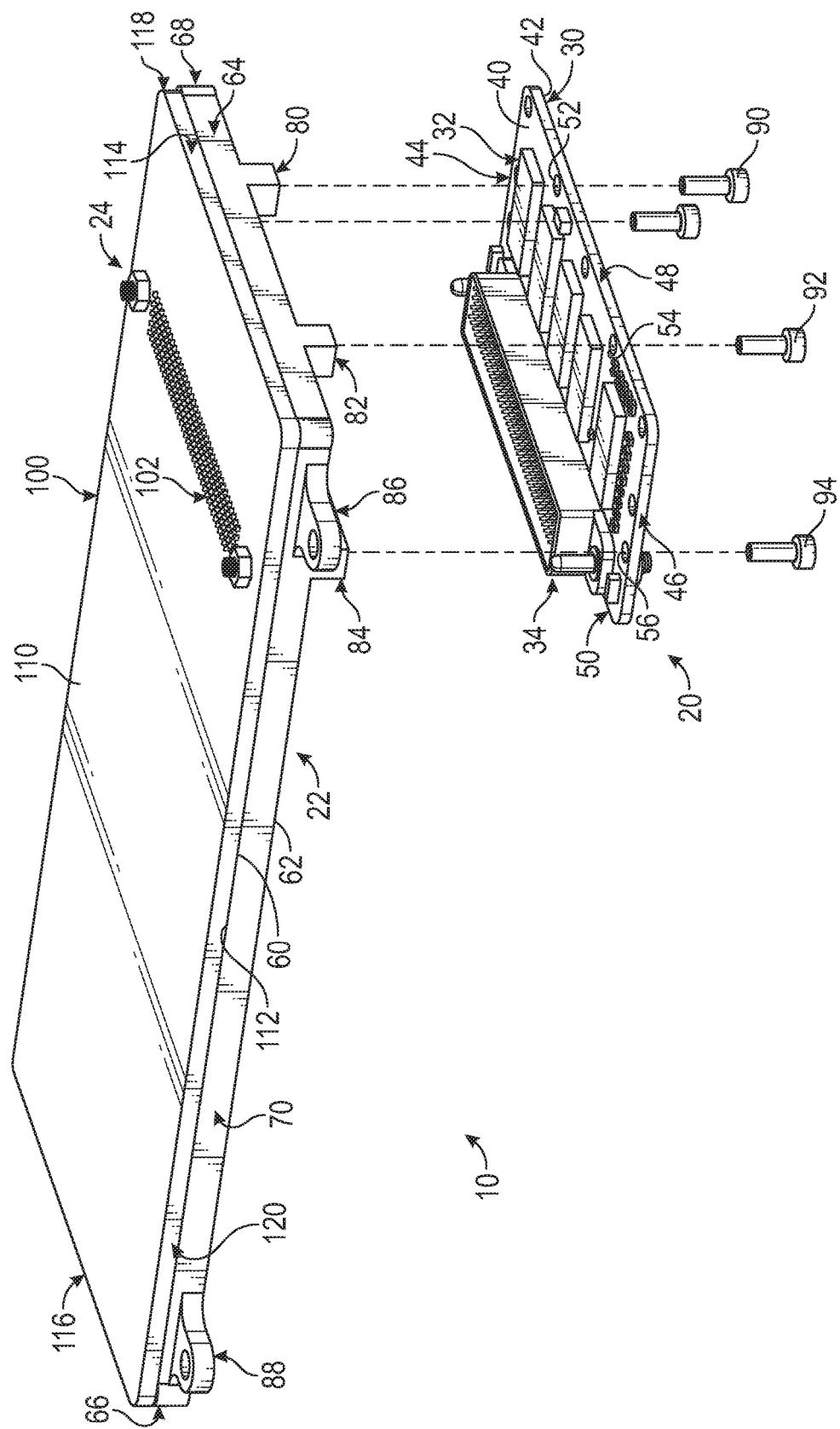

DDR ELECTRONIC MODULE ASSEMBLY

STATEMENT OF FEDERAL SUPPORT

This invention was made with Government support under contract number FA8626-15-D-0015 1902 awarded by the United States Air Force. The Government has certain rights in the invention.

BACKGROUND

Exemplary embodiments pertain to the art of aerospace DDR memory modules.

Double data rate (DDR) memory packages and dual in-line memory modules (DIMM) are generally not designed to withstand high temperature and vibratory environments. The application of DDR memory packages and DIMMs and aerospace applications may be required to survive higher thermal and vibration cycles in non-aerospace applications. Thermal and vibration cycles may decrease the service life of the DDR memory packages and DIMMs. Accordingly it is desirable to provide a more robust DDR memory package or DIMM that is capable of withstanding high thermal and vibration cycles and aerospace applications.

BRIEF DESCRIPTION

Disclosed is an electronic module assembly having a memory module. The memory module includes a first board, a plurality of memory packages, and a first connector. The first board has a first board first surface disposed opposite a first board second surface. Each surface extends longitudinally between a first board first end and a first board second end and each laterally extends between a first board first side and a first board second side. The first board defines a first opening that is disposed proximate the first board first side and the first board first end and a second opening that is disposed proximate the first board first side and the first board second end. The plurality of memory packages are disposed on the first board first surface proximate the first board first side. The first connector is disposed on the first board first surface proximate the first board second side.

In addition to one or more of the features described herein, the electronic module assembly further includes an electronic module having a second board. The electronic module can have various functions, which will depend on the application. The second board has a second board first surface disposed opposite a second board second surface that faces the first board first surface. Each surface extends laterally between a second board first end and a second board second end and each extends longitudinally between a second board first side and a second board second side. The electronic module has a first post disposed proximate the second board first end and the second board first side and a second post disposed proximate the second board first end and the second board second side.

In addition to one or more of the features described herein, the first post is proximately aligned with the first opening.

In addition to one or more of the features described herein, the second post is proximately aligned with the second opening.

In addition to one or more of the features described herein, the electronic module assembly includes a first fastener arranged to extend through the first opening and into the first post; and a second fastener arranged to extend through the second opening and into the second post.

In addition to one or more of the features described herein, the electronic module has a second connector disposed on the second board second surface proximate the second board first end and arranged to interface with the first connector.

In addition to one or more of the features described herein, the first board is made of a first material and the plurality of memory packages are made of a second material.

In addition to one or more of the features described herein, the first material and the second material have substantially similar coefficients of thermal expansion.

Also disclosed is an electronic module assembly that includes a memory module and an electronic module. The memory module includes a first board having a first board first surface disposed opposite a first board second surface. Each surface extends longitudinally between a first board first end and a first board second end and laterally between a first board first side and a first board second side. The electronic module is operatively connected to the memory module. The electronic module includes a mounting plate. The mounting plate has a mounting plate first surface that is disposed opposite a mounting plate second surface that faces towards the first board first surface. Each surface extends laterally between a mounting plate first end and a mounting plate second end and longitudinally between a mounting plate first side and a mounting plate second side. The mounting plate has a first post extending from the mounting plate second surface and disposed proximate the mounting plate first end and a second post spaced apart from the first post. The second post extends from the mounting plate second surface and is disposed proximate the mounting plate first end.

In addition to one or more of the features described herein, the electronic module has a second board having a second board first surface disposed opposite a second board second surface that is disposed on the mounting plate first surface.

In addition to one or more of the features described herein, the first board defines a first opening that is proximately aligned with the first post and a second opening that is proximately aligned with the second post.

In addition to one or more of the features described herein, the mounting plate has a third post extending from the mounting plate second surface and disposed proximate the mounting plate second side.

In addition to one or more of the features described herein, the first board defines a third opening that is proximately aligned with the third post.

In addition to one or more of the features described herein, the mounting plate has a first mounting lug extending from the mounting plate second side and disposed proximate the mounting plate first end.

In addition to one or more of the features described herein, the memory module has a plurality of memory packages disposed on the first board first surface proximate the first board first side and extending between the first board first end and the first board second end.

In addition to one or more of the features described herein, the first board is made of a first material and the plurality of memory packages are made of a second material.

In addition to one or more of the features described herein, the first material and the second material have substantially similar coefficients of thermal expansion.

In addition to one or more of the features described herein, the memory module has a first connector disposed on the first board first surface.

In addition to one or more of the features described herein, the electronic module has a second connector disposed on the second board second surface and extends through the mounting plate, the second connector being arranged to interface with the first connector.

BRIEF DESCRIPTION OF THE DRAWINGS

The following descriptions should not be considered limiting in any way. With reference to the accompanying drawings, like elements are numbered alike:

The FIGURE is a disassembled view of an electronic module assembly.

DETAILED DESCRIPTION

A detailed description of one or more embodiments of the disclosed apparatus and method are presented herein by way of exemplification and not limitation with reference to the Figures.

Referring to the FIGURE, an electronic module assembly 10 is shown. The electronic module assembly 10 is capable of surviving high temperature and vibratory environments that may be present in aerospace applications. The electronic module assembly 10 includes a memory module 20, a mounting plate 22, and an electronic module 24.

The memory module 20 includes a first board 30, a plurality of memory packages 32, and a first connector 34.

The first board 30 is a printed circuit board (PCB) or a printed wire board (PWB) substrate that is made of a first material. The first material has a first thermal expansion rate or a first coefficient of thermal expansion.

The first board 30 has a first board first surface 40 that is disposed opposite the first board second surface 42. The first board first surface 40 and the first board second surface 42 each extend longitudinally between a first board first end 44 and a first board second end 46. The first board first surface 40 and the first board second surface 42 each extend laterally between a first board first side 48 and the first board second side 50.

The first board 30 defines a first opening 52, a second opening 54, and a third opening 56. The first opening 52 is disposed proximate the first board first side 48 and the first board first end 44. The first opening 52 extends from the first board first surface 40 to the first board second surface 42. The second opening 54 is disposed proximate the first board first side 48 and the first board second end 46. The second opening 54 extends from the first board first surface 40 to the first board second surface 42. The third opening 56 is spaced apart from the second opening 54 and is disposed proximate the first board first side 48. The third opening 56 extends from the first board first surface 40 to the first board second surface 42.

The plurality of memory packages 32 are disposed on the first board first surface 40 and are disposed proximate the first board first side 48. The plurality of memory packages 32 extend between the first board first end 44 and the first board second end 46. The plurality of memory packages 32 are spaced apart from the openings.

The plurality of memory packages 32 may be joined to the first board 30 using solder or other materials. The plurality of memory packages 32 are made of a second material that has a second thermal expansion rate or a second coefficient of thermal expansion. The first coefficient of thermal expansion of the first board 30 is substantially similar to the second coefficient of thermal expansion of the plurality of memory packages 32. The substantially similar coefficients of thermal expansion between the first material of the first board 30 and the second material of the plurality of memory packages 32 leads to smaller differences in thermal expansion rate between the first board 30 and the plurality of memory packages 32 and may reduce potential issues of the solder joint (between the first board 30 and the plurality of memory packages 32) due to thermal cycling and may increase the service life of the electronic module assembly 10.

The first connector 34 is disposed on the first board first surface 40 and is disposed proximate the first board second side 50. The first connector 34 may be a robust aerospace grade connector that interconnects the memory module 20 with a connector of the electronic module 24.

The mounting plate 22 is disposed between the memory module 20 and the electronic module 24. The mounting plate 22 has a mounting plate first surface 60 that is disposed opposite a mounting plate second surface 62. The mounting plate second surface 62 faces towards the first board first surface 40. The mounting plate first surface 60 and the mounting plate second surface 62 each extend laterally between a mounting plate first end 64 and a mounting plate second end 66. The mounting plate first surface 60 and the mounting plate second surface 62 each extend longitudinally between a mounting plate first side 68 and a mounting plate second side 70.

The mounting plate 22 has a first post 80, a second post 82, a third post 84, a first mounting lug 86, and a second mounting lug 88.

The first post 80 extends away from the mounting plate second surface 62 and is disposed proximate the mounting plate first end 64. The first post 80 is proximately aligned with the first opening 52 and a first fastener 90 is arranged to extend through the first opening 52 and into the first post 80 to operatively connect the memory module 20 to the electronic module 24.

The second post 82 is spaced apart from the first post 80. The second post 82 extends away from the mounting plate second surface 62 and is disposed proximate the mounting plate first end 64. The second post 82 is proximately aligned with the second opening 54 and a second fastener 92 is arranged to extend through the second opening 54 and into the second post 82 to operatively connect the memory module 20 to the electronic module 24.

The third post 84 is spaced apart from the second post 82. The third post 84 extends away from mounting plate second surface 62 and is disposed proximate the mounting plate second side 70. The third post 84 is proximately aligned with the third opening 56 and a third fastener 94 is arranged to extend through the third opening 56 and into the third post 84 to operatively connect the memory module 20 to the electronic module 24.

The first mounting lug 86 extends from the mounting plate second side 70 and is disposed proximate the mounting plate first end 64. The second mounting lug 88 is spaced apart from the first mounting lug 86. The second mounting lug 88 extends from the mounting plate second side 70 and is disposed proximate the mounting plate second end 66.

The electronic module 24 is operatively connected to the memory module 20. The electronic module 24 includes a second board 100 and a second connector 102.

The second board 100 has a second board first surface 110 that is disposed opposite a second board second surface 112. The second board second surface 112 faces towards the first board first surface 40 and is disposed on the mounting plate first surface 60. The second board first surface 110 and the second board second surface 112 each extend laterally between a second board first end 114 and a second board second end 116. The second board first end 114 and the mounting plate first end 64 are proximately aligned with the first board first side 48 such that the first post 80 is disposed proximate the second board first end 114 and the second board first side 118.

The second board first surface 110 and the second board second surface 112 each extend longitudinally between a second board first side 118 and a second board second side 120. The second board second side 120 and the mounting plate second side 70 are proximately aligned with the first board second end 46 such that the second post 82 is disposed proximate the second board first end 114 and the second board second side 120.

In at least one embodiment, the first post 80, the second post 82, and the third post 84 may be provided as part of the second board 100 and may extend from the second board second surface 112 towards the first board first surface 40, such that the mounting plate 22 may not be employed. Still in further embodiments, the first post 80, the second post 82, and the third post 84 may be provided as part of the first board 30 and may extend from the first board first surface 40 towards the second board second surface 112 such that the mounting plate 22 may not be employed.

The second connector 102 is disposed on the second board second surface 112 and may at least partially extend through the second board first surface 110. The second connector 102 is disposed proximate the second board first end 114 and extends through the mounting plate 22. The second connector 102 may be a robust aerospace grade connector that is arranged to interface with the first connector 34 to electrically connect the memory module 20 with the electronic module 24. The first connector 34 and the second connector 102 are arranged to reduce relative motion between the electrical contact points of the respective connector to reduce fretting, reduce induced vibrations, and increase service life of the electronic module assembly 10.

In at least one embodiment, the electronic module assembly 10 is provided with copper backing, layers, or sheeting and/or thermal heat sink that are strategically incorporated into at least one of the first board 30 and the second board 100 to accommodate installation of the electronic module assembly 10 into a high temperature environment.

The incorporation of the posts, the aerospace grade connectors, the copper and the thermal heat sinks improve the ability of the electronic module assembly 10 to operate in harsh environments, such as environments having high vibrations and high temperature, to increase total performance, structural performance, and service life of the electronic module assembly 10.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. An electronic module assembly, comprising:
    a memory module, having:
        a first board having a first board first surface disposed opposite a first board second surface, each extending longitudinally between a first board first end and a first board second end and each extending laterally between a first board first side and a first board second side, the first board defining a first opening disposed proximate the first board first side and the first board first end and a second opening disposed proximate the first board first side and the first board second end;
        a plurality of memory packages disposed on the first board first surface proximate the first board first side; and
        a first connector disposed on the first board first surface proximate the first board second side;
    an electronic module, having:
        a second board having a second board first surface disposed opposite a second board second surface that faces the first board first surface each extending laterally between a second board first end and a second board second end and longitudinally between a second board first side and a second board second side, the electronic module having a first post disposed proximate the second board first end and the second board first side and a second post disposed proximate the second board first end and the second board second side,
    wherein the first post is proximately aligned with the first opening and the second post is proximately aligned with the second opening;
    a first fastener arranged to extend through the first opening and into the first post; and
    a second fastener arranged to extend through the second opening and into the second post.

2. The electronic module assembly of claim 1, wherein the electronic module has a second connector disposed on the second board second surface proximate the second board first end and arranged to interface with the first connector.

3. The electronic module assembly of claim 1, wherein the first board is made of a first material and the plurality of memory packages are made of a second material.

4. The electronic module assembly of claim 3, wherein the first material and the second material have substantially similar coefficients of thermal expansion.

5. An electronic module assembly, comprising: a memory module having a first board having a first board first surface disposed opposite a first board second surface each extending longitudinally between a first board first end and a first board second end and laterally between a first board first side and a first board second side; and an electronic module operatively connected to the memory module, electronic module having: a mounting plate having a mounting plate first surface disposed opposite a mounting plate second surface that faces towards the first board first surface, each extending between a mounting plate first end, a mounting plate second end, a mounting plate first side, and a mounting plate second side, the mounting plate having a first post and a second post spaced apart from the first post wherein the electronic module has a second board having a second board first surface disposed opposite a second board second surface that is disposed on the mounting plate first surface; wherein the first board defines a first opening that is proximately aligned with the first post and a second opening that is proximately aligned with the second post.

6. The electronic module assembly of claim 5,
wherein the mounting plate has a third post extending from the mounting plate second surface and disposed proximate the mounting plate second side.

7. The electronic module assembly of claim 6, wherein the first board defines a third opening that is proximately aligned with the third post.

8. The electronic module assembly of claim 5, wherein the mounting plate has a first mounting lug extending from the mounting plate second side and disposed proximate the mounting plate first end.

9. The electronic module assembly of claim 5, wherein the memory module has a plurality of memory packages disposed on the first board first surface proximate the first board first side and extending between the first board first end and the first board second end.

10. The electronic module assembly of claim 8, wherein the first board is made of a first material and the plurality of memory packages are made of a second material.

11. The electronic module assembly of claim 9, wherein the first material and the second material have substantially similar coefficients of thermal expansion.

12. The electronic module assembly of claim 8, wherein the memory module has a first connector disposed on the first board first surface.

13. The electronic module assembly of claim 11, wherein the electronic module has a second connector disposed on the second board second surface and extends through the mounting plate, the second connector being arranged to interface with the first connector.

* * * * *